United States Patent [19]

Dooley et al.

[11] Patent Number: 5,104,481
[45] Date of Patent: Apr. 14, 1992

[54] METHOD FOR FABRICATING LASER GENERATED I.C. MASKS

[75] Inventors: Daniel J. Dooley, Saratoga; Arthur R. Elsea, Jr., Fremont, both of Calif.

[73] Assignee: Lasa Industries, Inc., San Jose, Calif.

[21] Appl. No.: 613,964

[22] Filed: Nov. 15, 1990

Related U.S. Application Data

[63] Continuation of Ser. No. 250,833, Sep. 28, 1988, abandoned, which is a continuation-in-part of Ser. No. 199,055, May 26, 1988, abandoned.

[51] Int. Cl.$^5$ .......................................... H01L 21/268
[52] U.S. Cl. ................................... 156/643; 156/657; 219/121.68; 219/121.69
[58] Field of Search ..................... 156/643, 657, 655; 219/121.68, 121.69; 264/1.4

[56] References Cited

U.S. PATENT DOCUMENTS

| | | | |
|---|---|---|---|
| 3,889,272 | 6/1975 | Lou et al. | 219/121.69 |
| 3,924,093 | 12/1975 | Feldman et al. | 219/121.69 |
| 4,113,486 | 9/1978 | Sato | 156/643 |
| 4,450,041 | 5/1984 | Aklufi | 156/643 |
| 4,830,978 | 5/1989 | Teng | 437/67 |

*Primary Examiner*—Richard V. Fisher
*Assistant Examiner*—Todd J. Burns
*Attorney, Agent, or Firm*—Cushman, Darby & Cushman

[57] ABSTRACT

An improved method of making masks includes forming a layer of amorphous silicon of about 2,000 angstroms on a transparent substrate. A laser beam is directed through the transparent substrate traverses the amorphous silicon to form a pattern of crystallized silicon. The n-crystallized silicon is etched leaving a patterned substrate. The patterned substrate is used as a mask for exposing photoresist on semiconductor elements.

17 Claims, 1 Drawing Sheet

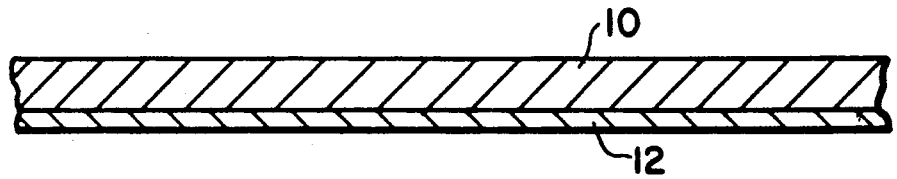
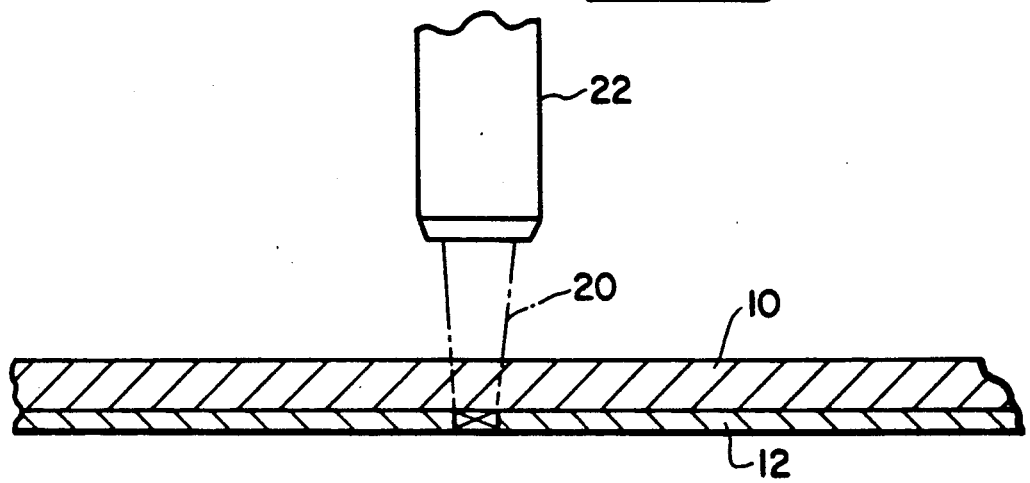
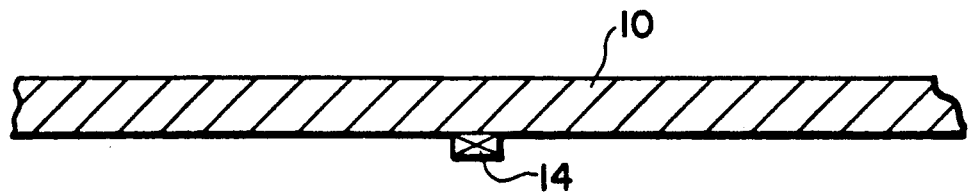

METHOD FOR FABRICATING LASER GENERATED I.C. MASKS

BACKGROUND OF THE INVENTION

This is a continuation of application Ser. No. 07/250,833, filed on Sept. 28, 1988, which was abandoned upon the filing hereof which is a CIP application Ser. No. of 07,199,055 filed May 26, 1988, now abandoned, for Laser Generated I.C. Pattern and which is assigned to the common assignee herewith. The subject matter of U.S. Pat. Ser. application No. 07/199,055 is incorporated herein by reference.

This invention relates to an improved method of using a laser to generate optical masks for use in patterning layers on semiconductor elements.

Various techniques for generating optical masks have been developed wherein, for example, an electron beam "writes" a pattern in photoresist on a glass or quartz mask blank. An older technology exposes photoresist on a mask blank by flashing focused light through a properly chosen aperture. Some of these prior mask generating techniques have also included the use of laser beams. In all of these older techniques a photoresist is used for the optically active material. Photoresists have limitations that make it difficult to make the high-precision masks that are required for integrated circuit and semiconductor device manufacture. Among these limitations are the difficulty of spin coating the glass or quartz substrate to obtain a uniform coating, the pre-exposure oven bake, the wet development of the exposed photoresist, the post development oven bake, adhesion problems at any step within the process, and the sensitivity of the resist to alpha and gamma particles. All of these process steps are prone to introduce defects in the final optical mask that will reduce the device yield.

Accordingly, there is a need in the art for an improved method of patterning semiconductor masks. It is desirable that such a method be capable of being performed quickly and capable of economically producing high quality masks.

SHORT STATEMENT OF THE INVENTION

The present invention is an improved method of producing optical masks for the manufacture of semiconductor devices. In accordance with the invention, a thin layer, for example, 2,000 angstroms, of amorphous silicon is blanket deposited over the surface area of a glass or quartz substrate. A focused laser beam with sufficient power having a wavelength of, for example, 5,145 angstroms, is directed onto the amorphous silicon layer and traverses over the layer to form the pattern required for that particular mask. The laser beam heats the amorphous silicon in areas where the pattern is to occur, thereby crystallizing the silicon Using conventional plasma etching or reactive ion etching techniques, such as, a conventional $SF_6$ plasma etch, the non-crystallized amorphous silicon layer is etched away. The etching process is sufficiently selective to remove the amorphous silicon layer, yet leave the crystallized silicon pattern on the glass or quartz substrate.

The patterned substrate can now be used as a mask in a conventional optical aligner whether it be a contact or projection aligner.

An advantage of the present invention is the elimination of photoresist and its inherent process problems and yield losses due to defects.

BRIEF DESCRIPTION OF THE DRAWINGS

Other improvements, advantages and features of the present invention will become more fully apparent from the following detailed description of the preferred embodiment, the appended claims and the accompanying drawings in which:

FIG. 1 illustrates a glass or quartz substrate coated with amorphous silicon;

FIG. 2 illustrates the laser exposure step in the mask making process; and

FIG. 3 illustrates the final masks after plasma processing to remove the uncrystallized amorphous silicon.

DESCRIPTION OF THE PREFERRED EMBODIMENT

Referring now to FIG. 1 which, by way of example, illustrates the preferred embodiment of the present invention. It should be appreciated that the laser generated IC mask pattern may be utilized in connection with any layer or mask pattern desired for fabricating the device being manufactured. Regardless of the mask pattern desired, the initial step is a deposition of a thin layer of amorphous silicon onto a glass or quartz substrate. The glass or quartz substrate is used as a substrate for a thin, preferably 2,000 angstroms or less, layer of amorphous silicon. The substrate should be of the type similar to that used for conventional masks using photoresist having an optically flat surface and with a low coefficient of thermal expansion. Shown in FIG. 1 is a glass substrate 10 having a 2,000 angstrom layer of amorphous silicon 12.

A focused laser beam 20, illustrated in FIG. 2, having a wavelength of, for example, 5,145 angstroms, is emitted from a laser source 22. The laser beam 20 is focused through the substrate onto the amorphous silicon. The laser beam traverses the substrate in the pattern desired. The beam 20 heats the amorphous silicon layer 12 causing the amorphous silicon to be crystallized. Because no deposition has taken place during this pattern formation step, there is no gas dynamic or chemical reaction time limitations. The write time limitation on the rate of formation of the pattern is heat limited by the time needed to crystallize the amorphous silicon.

In a subsequent processing step, as illustrated in FIG. 3, a blanket etching by a dry etch technique removes the amorphous silicon, but not the pattern of crystallized silicon 14 formed by the traversal of the laser beam over the substrate. Using $SF_6$ as a plasma etch gas, the amorphous silicon is removed leaving only the crystallized silicon pattern. The etching characteristics of crystallized silicon is different from that of amorphous silicon causing a differential rate of etching which is sufficient to leave a pattern of crystallized silicon, whereas the amorphous silicon is completely removed.

An advantage of the present invention is that there is no lateral growth of the crystallized pattern region as the laser beam heats amorphous silicon. It provides for a pattern having very accurate dimensions. The width of the pattern can be accurately controlled over a range of less than 1 micron to 50 microns or greater. For wider patterns, several scans of the laser beam may be required.

Another advantage of the present invention is that the number of steps in producing a mask is significantly reduced. Just as there is chromium or similar material first deposited onto the substrate in the conventional mask making process, there is in the present invention the deposition step of depositing the amorphous silicon layer. Also, there is the exposure step inn both conventional mask making and in the present invention. In conventional mask making this exposure step may be with an electron beam, with focused light through a suitable aperture, or with a laser beam. In the present invention, the exposure step is with a laser beam. There is an etching step in both conventional processing and in the present invention. This etching step is usually by dry etching techniques in conventional mask making as it is in the present invention.

However, in the present invention many steps are eliminated. The steps that are eliminated include the photoresist spin coating step, the preexposure oven bake step, the wet development of the photoresist step, the post development oven hard bake step, and the photoresist removal step. The elimination of these many photoresist steps is the reason the present invention offers a significant improvement in mask making yield and, therefore, in manufactured device yield.

Shown in FIG. 3 is the completed optical mask after plasma etching. The mask as shown is ready for use in a contact aligner, a stepper, or a projection aligner. It should be appreciated that as used herein, the term optical mask includes photomasks, electron beam masks and x-ray masks.

While the preferred embodiment has been disclosed in connection with the preferred embodiment thereof, it should be appreciated that other embodiments may be utilized in keeping with the spirit and scope of the present invention as defined by the appended claims.

What is claimed is:

1. A method of making a mask comprising the steps of:
   depositing a layer of material which changes state when activated on a transparent substrate;
   directing an output of a laser beam, through said transparent substrate, to selected regions of said layer to activate said selected regions and thereby form a pattern of activated regions that have changed state; and
   removing areas of said layer that have not been activated, to form a patterned substrate.

2. The method of claim 1 wherein said deposited layer is amorphous silicon.

3. The method of claim 2 wherein said amorphous silicon is less than about 2,000 angstroms thick.

4. The method of claim 2 wherein said directing step comprises the step of selectively heating regions of said amorphous silicon layer to form a pattern of crystallized silicon.

5. The method of claim 4 wherein said heating step comprises the step of traversing a focused laser beam over the surface of said amorphous silicon to form a pattern of n-crystallized silicon.

6. The method of claim 5 wherein the n-crystallized silicon is etched in a plasma process.

7. Method of claim 5 wherein said amorphous silicon is crystallized when traversed by said laser beam by heating the amorphous silicon to between 400 to 500° C.

8. A method of improving making masks comprising the steps of:
   depositing a layer of material which changes state when activated on a transparent substrate;
   directing an output of a laser beam, through said transparent substrate, to selected regions of said layer to activate said selected regions and thereby form a pattern of activated regions;
   removing areas of said layer which are not activated to form a patterned substrate; and
   using the patterned substrate as a mask in a process for exposing a photoresist on semiconductor elements.

9. A method of improving making masks for manufacturing integrated circuits comprising the steps of:
   depositing an amorphous silicon layer on a transparent substrate;
   directing an output of a laser beam through said transparent substrate, to selected regions of said amorphous silicon layer to crystallize said selected regions and to form a pattern of crystallized regions;
   etching areas of said amorphous silicon layer not crystallized to form a patterned transparent substrate; and
   using the patterned transparent substrate as a mask in a process for exposing photoresist on semiconductor elements.

10. The method of claim 9 wherein said amorphous silicon layer is less than or about 2,000 angstroms in thickness.

11. A method of improving making masks for manufacturing integrated circuits comprising the steps of:
    depositing an amorphous silicon layer on a transparent substrate;
    directing an output of a laser beam through said transparent substrate, to selectively heat regions of aid amorphous silicon to form a pattern of crystallized silicon;
    etching areas of said amorphous silicon layer not crystallized too form a patterned transparent substrate; and
    using the patterned transparent substrate as a mask in a process for exposing photoresist on semiconductor elements.

12. The method of claim 11 wherein said heating step comprises the step of traversing a focused laser beam across and through said transparent substrate to said amorphous silicon to form a pattern of crystallized silicon.

13. The method of claim 12 wherein said focused laser beam has a wavelength of about 5,145 angstroms.

14. The method of claim 11 wherein the n-crystallized silicon is etched in a plasma process.

15. The method of claim 14 wherein the plasma etchant gas is a hydrogenated gas.

16. The method of claim 14 wherein the plasma etchant gas is sulfur hexaflouride.

17. The method of claim 11 wherein said amorphous silicon layer is less than about 2,000 angstroms and wherein said amorphous silicon layer is crystallized by being heated to a temperature of between 400 and 500 degrees C. during said heating step.

* * * * *